United States Patent [19]
Ito et al.

[11] Patent Number: 5,270,259
[45] Date of Patent: Dec. 14, 1993

[54] METHOD FOR FABRICATING AN INSULATING FILM FROM A SILICONE RESIN USING $O_2$ REACTIVE ION ETCHING

[75] Inventors: Shinichi Ito, Machida; Yoshio Homma, Tokyo; Eiji Sasaki, Akishima; Natsuki Yokoyama, Mitaka, all of Japan

[73] Assignees: Hitachi, Ltd., Tokyo; Hitachi VLSI Engineering Corporation, Kodaira, both of Japan

[21] Appl. No.: 667,364

[22] Filed: Mar. 11, 1991

Related U.S. Application Data

[63] Continuation of Ser. No. 365,730, Jun. 14, 1989, abandoned.

[30] Foreign Application Priority Data

Jun. 21, 1988 [JP] Japan .................. 63-151102

[51] Int. Cl.⁵ ............ H01L 21/00; H01L 21/02; H01L 21/469; H01L 21/31
[52] U.S. Cl. ................ 437/235; 437/231; 437/238; 156/643; 156/663
[58] Field of Search ............ 437/225, 228, 229, 235, 437/238, 231; 156/643, 663

[56] References Cited

U.S. PATENT DOCUMENTS

| | | | |
|---|---|---|---|
| 4,349,609 | 9/1982 | Takeda et al. | 437/203 |
| 4,464,460 | 8/1984 | Hiraoka | 156/643 |
| 4,723,978 | 2/1988 | Clodgo et al. | 156/663 |

FOREIGN PATENT DOCUMENTS

| | | | |
|---|---|---|---|
| 0108842 | 6/1985 | Japan | 437/229 |
| 0106632 | 5/1987 | Japan | |

OTHER PUBLICATIONS

Schiltz, A., Advantages of Using Spin-On-Glass Layer in Interconnection Dielectric Planarization, Microelectronic Engineering, 5, 1986, North-Holland, pp. 413-421.

Butherus, $O_2$ plasma-converted spin-on-glass for planarization, J. Vac. Sci. Tech. B3(5), Sep./Oct. 1985, pp. 1352-1356.

Sze, VLSI Technology, p. 312, McGraw-Hill, 1983.

*Primary Examiner*—Brian E. Hearn
*Assistant Examiner*—B. Everhart
*Attorney, Agent, or Firm*—Antonelli, Terry, Stout & Kraus

[57] ABSTRACT

A silicone resin is applied on a substrate to form a coating film. The coating film is subjected to a reactive ion etching in an atmosphere containing at least $O_2$. Thus, the film is inorganized in its surface and has a distribution of the residue, an organic radical, contained therein gradually increasing in the depth thereof. This permits an insulating film having excellent heat endurance to be formed without generation of any cracks. This insulating film is very useful as an interlayer insulating film for multi-layer wiring.

25 Claims, 5 Drawing Sheets

METHOD FOR FABRICATING AN INSULATING FILM FROM A SILICONE RESIN USING O₂ REACTIVE ION ETCHING

This application is a continuation of application Ser. No. 07/365,730, filed Jun. 14, 1989 now abandoned.

BACKGROUND OF THE INVENTION

The present invention relates to a method for fabricating an insulating film in the case of using silicone resin as the insulating film and, more particularly, to a method for fabricating an insulating film which has resistance to an ashing treatment, and which is suitable to planarize a miniaturized wiring structure such as that of an LSI.

As a spin coated film of an insulating film to be used for a semiconductor device, there have been known two kinds of insulating films including an inorganic SOG and an organic system. The inorganic system insulating film is a material called "SOG" (Spin-on-Glass) which is applied on a semiconductor substrate by spin-coating a raw solution in which silanole is solved in solution consisted of water and alcohol on the semiconductor substrate and is easily converted to glass-like state through heating. SOG is excellent in its heat and chemical stability. And SOG is also excellent in its planarizing characteristic as compared with the inorganic film formed by conventional CVD since it can be formed by spin coat of the SOG solution. For this reason, SOG has been widely used. However, with the development of the degree of miniaturization and high density of a semiconductor device, a processing technique to cope with the order of submicron device is now required. Then, the planarizing technique using conventional SOG no longer is sufficient, and the planarizing capability must be further improved. As well known, a semiconductor device having a miniaturized structure is necessarily required to have a substrate having a planarized surface. Then, the SOG film used must have a thickness increased to a certain degree. However, if the thickness is excessively increased, the inorganic SOG film will generate some cracks in its film itself. Thus, the thickness can be increased to 0.2 μm at most, but not further increased.

On the other hand, the organic system spin coat-type insulating film can have a remarkably increased thickness and, more specifically, can have a thickness of 1 μm or so without any cracks. Silicone resin is known as this organic system insulator. The silicone resin is a generic term for an organic polymer having the repetition of a siloxane bond $+Si-O+_n$ as a main chain and alkyl, aryl or the like as a side radical. The planarizing capability of the substrate topography by the organic SOG is remarkably excellent as compared with that by the inorganic SOG as mentioned above. Such silicone resin is discussed in JP-A-62-106632, for example.

Although the above silicone resin insulator film is excellent in the capability of increasing the film thickness as compared with the inorganic SOG film, it is inferior in the thermal resistivity and provides a problem that some cracks will be generated when the ashing treatment indispensable to the processing for fabricating a semiconductor device is performed.

The ashing treatment is a process in which the organic such as photoresist formed on a semiconductor substrate is removed by oxidizing and vaporizing it using oxygen plasma. The ashing treatment is generally performed using a barrel type plasma reactor. The pressure of O₂ gas used in the ashing treatment is generally as comparatively high as 1-5 Torr, and the mean free path thereof is short so that the main component of the plasma is a radical. When the silicone film is subjected to the ashing treatment, the film is converted to SiO₂ with the organic component in the film burning due to abrupt oxidation. Since the semiconductor substrate is heated by the plasma during the ashing treatment, the reaction will be further accelerated. SiO₂ generated through the reaction with the radical is porous so that a new radical passes through the SiO₂ layer on the substrate surface to react with the underlying silicone layer. Such a reaction abruptly occurs so that cracks are generated due to the contraction of the film resulting from the film conversion to SiO₂-like state. For example, the following experimental results have been provided by the inventor of the present invention.

First, a commercially available SOG solution in which a monomer and oligomer of $RSi(OH)_3$, $R_2Si(OH)_2$ and $Si(OH)_4$ (R is a methyl function: $-CH_3$) are solved in an alcohol solvent at their suitable rate was prepared. This SOG solution was spin-coated (applied) on a semiconductor substrate to provide a film (hereinafter referred to an application film) having a thickness of 0.6 μm. This film was baked at 200° C. for 30 minutes and at 450° C. for 30 minutes in an N₂ gas atmosphere. Two samples thus prepared were subjected to an O₂ plasma ashing treatment in a barrel type plasma asher. The O₂ gas pressure was 5 Torr and the plasma power was 300 W.

Figure 2:
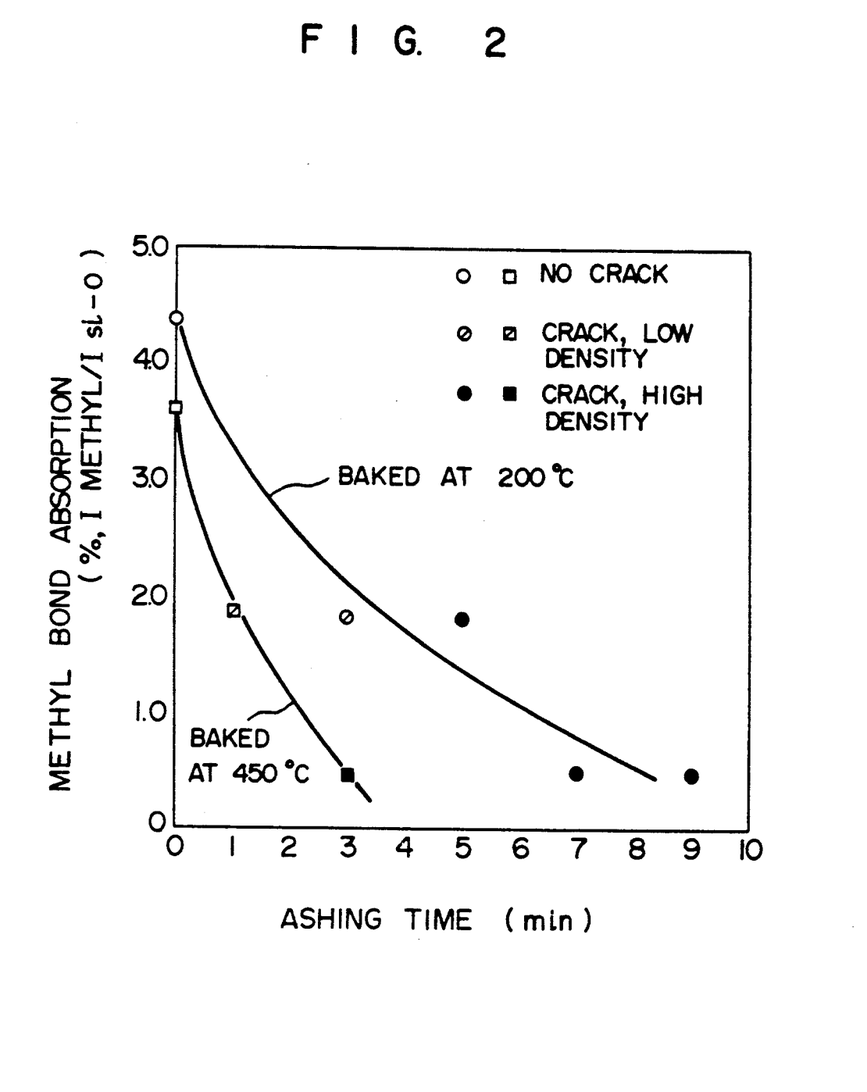
FIGS. 2 to 5 are graphs for explaining meritorious effects of the present invention.

FIG. 2 shows the treatment time dependency of the peak intensity of the methyl (R) band absorption in the above two samples in an infrared absorption measurement. The ordinate represents the ratio (%) of the absorption intensity of the methyl R ($I_{methyl}$) and that of the Si-O band ($I_{Si-O}$) in the insulating film, and the abscissa represents an ashing treatment time (minutes). As seen from FIG. 2, the O₂ plasma treatment in a short time abruptly decreases the amount of methyl function to substantially zero, which generated cracks in the entire film. Incidentally, the standard conditions in an ordinary ashing treatment in the above plasma asher are 300 W and ten minutes.

In this way, the silicone film easily generates cracks during the ashing if any processing other than the baking was not conducted in advance. This phenomenon is not peculiar to this silicone film but was observed for an organosiloxane ($R_2SiO$) spin coated film having a similar structure, which is commercially available.

JP-A-62-106632 discloses the following fact. When, in order to improve the resistance of an organic SOG film to plasma etching, this polymer film is exposed to the O₂ plasma (reactive ion etching) for 5 (five) minutes under a low pressure of $125 \times 10^{-6}$ Torr (0.125 m Torr), a surface layer of 500 Å is inorganized (substantially SiO₂) whereas a layer underlying this quality changed layer still has substantially the same composition as the film before the processing. Thus, the film is divided into two layers (the quality-changed layer and the unchanged layer). However, if the insulating film having the quality-changed layer is used as an interlayer insulating film in a multi-layer wiring, stress will be concentrated at the boundary between the above two layers, which remarkably deteriorates reliability of the wiring structure.

Incidentally, the spin coated film disclosed in JP-A-62-106632 is used as an underlying layer for a polyimide film and is formed as a very thin film which serves as a stopper layer in dry-etching the polyimide film and a binding layer therefor. Since this spin coated film has resistance to the dry-etching, it can be efficiently used as a stopper or binding layer. However, if the spin coated film subjected to the above processing ($O_2$ plasma processing) is to be used as an interlayer for the multi-level wiring structure for the purpose of planarizing the structure, it is required to have a thickness of at least 0.4–0.6 $\mu$m. Such a comparatively thick film subjected to above processing still provides a problem of crack generation during the ashing treatment, because it doesn't have a thick, quality-changed surface layer thick enough to prevent reactive plasma from reaching the inner unchanged organic layer. The problems mentioned above are problems to be solved by the present invention.

SUMMARY OF THE INVENTION

An object of the present invention is to solve the problems mentioned and to provide a improved method for fabricating an insulating film in the case where silicone resin is used as an interlayer insulating film of a multi-level wiring structure.

In order to attain the above object, in accordance with the present invention, a silicone resin is applied on a substrate on which an insulating film is to be formed to form an coated film; this coated film is baked and solidified under the temperature condition where it is not thermally decomposed; and the surface of the silicone film is exposed to a plasma under the atmosphere of the gas pressure of 10–400 m Torr, containing at least $O_2$ gas so that the surface layer becomes inorganic and also the quality of the film is changed to have a composition of gradually increasing the residue of an organic radical in the direction of an internal depth of the film.

Incidentally, the above $O_2$ gas containing reactive plasma treatment is hereinafter referred to as $O_2$ RIE (reactive ion etching), which is a process of exposing the film to the plasma of gas containing $O_2$ gas as a main component under the gas pressure of 10–400 m Torr.

DESCRIPTION OF THE PREFERRED EMBODIMENTS

As mentioned above, the surface of the coated film subjected to the $O_2$ RIE process is changed in its quality to be substantially $SiO_2$ and also the entire film is changed in its quality so that the residue of the organic radical such as alkyl and aryl exists at a concentration gradually increasing in the direction the internal depth of the film. Although the $O_2$ RIE process is commonly conducted using a parallel plate electrode plasma reactor, it may be conducted using a plasma apparatus in which plasma is generated by the use of electron cyclotron resonance or microwaves. In the present invention, as mentioned above, it is important to provide the residue of the organic radical at a distribution in which the concentration gradually increases in the direction of the internal depth of the film. And in order to realize this, an $O_2$ gas pressure in the range of 10–400 m Torr is required. The $O_2$ gas pressure lower than 10 m Torr and higher than 400 m Torr can not provide a remarkable effect of changing the quality of the film. Examples of the gas containing fluorine (F) as a composition element are CO, $CO_2$, NO, $NO_2$, etc. These gases serve to accelerate the quality changing reaction so that at least one of them can be used. Further, other gases may be used which contain as a composition element at least one of carbon (C), oxygen (0), nitrogen (N) or fluorine (F).

Further, in the $O_2$ RIE process, the temperature of a substrate during the process is also critical. A temperature lower than 150° C. is actually adopted and more preferably, the temperature of 50°–80° C. is adopted. Too high a temperature is not desired since the reaction is abruptly advanced. Thus, the substrate is cooled so that it is held at a desired temperature.

The silicone resin used in the present invention, as conventionally defined, is a generic term for an organic polymer having the repetition of a siloxane bond $+Si-O+_n$ as main chain with alkyl, aryl or the like a side radical.

The components of plasma acting on the coated film are ions and radicals. The ions are accelerated by an electric field to have high kinetic energy whereas the radicals, which are excited atoms or molecules, do not have high kinetic energy but are chemically active. As mentioned above, the ashing treatment using the $O_2$ plasma utilizes radical reaction to remove the organic film such as resist. The $O_2$ plasma processing adopted in the present invention is the $O_2$ RIE processing. Although this $O_2$ RIE process utilizes $O_2$ plasma, it is substantially different from the ashing treatment. More specifically, in the case of the $O_2$ RIE plasma process adopted in the present invention, the $O_2$ gas pressure is very low so that the ratio of ions is high and most of the ions are incident in the direction perpendicular to a substrate. This tendency is remarkable as the gas pressure is decreased. Also, the kinetic energy of the ions is increased as the gas pressure is decreased. On the other hand, in the case of the ashing treatment, a barrel type reactor is used and the gas pressure is high so that the ratio of ions is low and the momentums of ions and radicals do not have a specific direction.

Formed on the surface of the silicone resin film subjected to the $O_2$ RIE plasma processing is a dense $SiO_2$ layer due to collision of ions having high energy. The densified surface layer prevents the ions from invading into the silicone film and the thickness of the $SiO_2$ surface layer does not exceed a certain upper limit. However, the thickness and density of the $SiO_2$ surface layer greatly depend on the kind of gas and the gas pressure of the plasma. In the case of $O_2$ 100%, the formed $SiO_2$ layer has a tendency of being thick when the gas pressure is low and becoming thin as the gas pressure is increased. However, if the gas pressure is low, the thickness of the $SiO_2$ layer is greatly reduced due to the sputtering effect of high energy ions. Then, the gas pressure should be appropriately adjusted in order to provide a $SiO_2$ surface layer which is not so reduced in its thickness during the $O_2$ RIE plasma process and having a thickness enough to prevent the plasma invading during the ashing treatment.

Particularly, the desired gas pressure for changing the quality of the side wall of an opening provided in the silicone film is limited. The excessively low pressure has a high capability of densifying the $SiO_2$ surface layer since the particle energy is high, but is useless to change the quality of the side wall which is perpendicular to the substrate surface since the incident direction of the particle is also perpendicular to the substrate surface and parallel to the side wall surface. On the other hand, the excessively high gas pressure is useless to densify the $SiO_2$ surface layer since the particle energy is low. There is an intermediate gas pressure range where the number of ions having a vector component in the horizontal direction is increased and the ions have energy enough to densify the side wall surface layer.

As a result of detailed experiments in accordance with the present invention, it has been confirmed that such a suitable pressure range is 10–400 m Torr and the gas pressure in this range can preferably change the quality of the side wall of the opening.

Embodiment 1

FIGS. 1a to 1e show a process of fabricating a metal-level wiring structure in accordance with the present invention. This process is roughly as follows. A semiconductor substrate 1 with a wiring pattern 2 of a first level metal formed thereon is prepared. A silicone resin layer 3 is formed on the substrate 1. An opening 4 is made therein. A second level metal 5 is formed on the silicone resin layer 3. Thus, the two-level wiring structure including the silicone resin film 3 as an interlevel insulating film is completed. Respective steps of the process in accordance with one embodiment of the present invention using the silicone film subjected to the $O_2$ RIE treatment will be explained in order.

Figure 1A:
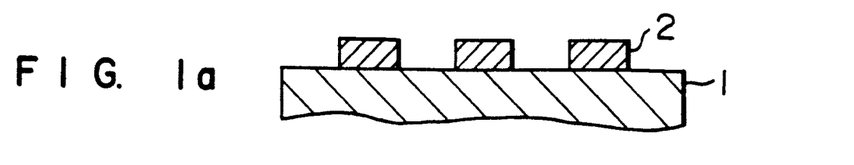
FIGS. 1a to 1e are diagrams showing a process in accordance with one embodiment of the present invention.

First, as shown in FIG. 1a, prepared was a substrate of e.g. single crystalline silicone in which a semiconductor device (5) (not shown) is incorporated and on the surface of which a first wiring pattern 2 having a thickness of 0.7 µm is previously formed.

Figure 1B:
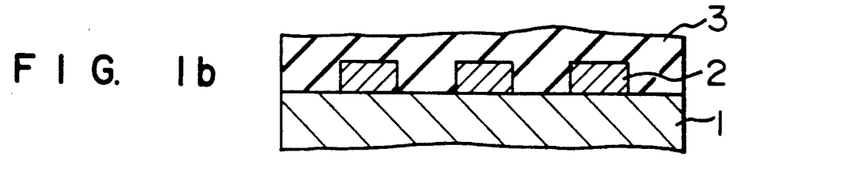

As shown in FIG. 1b, applied on the substrate 1 was a commercially available polymethyl siloxane solution in which a monomer and oligomer of $RSi(OH)_3$, $R_2Si(OH)_2$ and $Si(OH)_4$ (R is a methyl $CH_3$) are solved in an alcohol solvent at their suitable rate thereby to form a coated film 3 having a thickness of 1.0 µm. Thereafter, the coated film 3 was partially cured through baking in an $N_2$ gas atmosphere at 200° C. for 30 minutes.

Figure 1C:
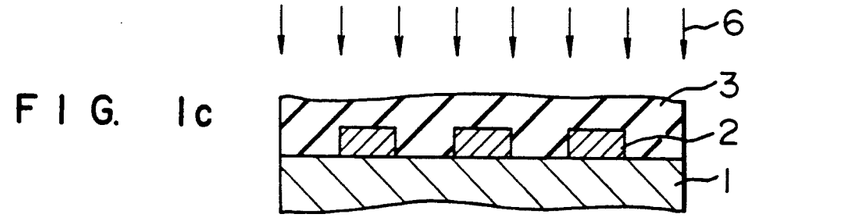

As shown in FIG. 1c, the coated film 3 was subjected to $O_2$ RIE plasma 6 under the condition of the $O_2$ pressure of 50 m Torr at 500 W for 30 minutes using a graphite susceptor. The coated film 3 after the $O_2$ RIE plasma process become substantially inorganic in its surface layer, while the methyl was left in a concentration distribution increasing in accordance to the increase of the internal depth of the film successive to the surface layer. When the above sample $O_2$ RIE plasma treated was subjected to an ordinary ashing at the $O_2$ gas pressure of 7 Torr for 10 minutes, the content of methyl function was almost unchanged and cracks were not generated. On the other hand, in the sample which was not subjected to the $O_2$ RIE plasma processing in accordance with the present invention, some cracks were generated. Thus, this sample was not suitable as a sample for subsequently forming a two-level wiring structure.

Figure 1D:
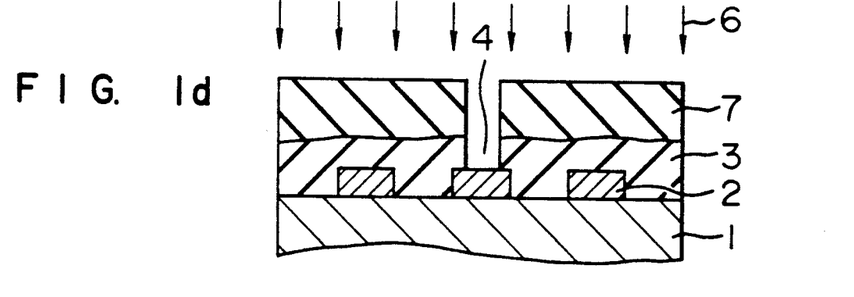

Next, as shown in FIG. 1d, a photoresist 7 was applied on the $O_2$ RIE plasma processed sample. And an opening 4 was provided in the photoresist 7 and the film through a predetermined circuit pattern mask by means of an ordinary dry etching technique using $C_2F_6$ as an etching gas. In this case, this opening was provided at such a depth that the surface of the wiring pattern 2 is exposed. Thereafter, the sample was subject to the same $O_2$ RIE plasma processing as mentioned above.

Figure 1E:
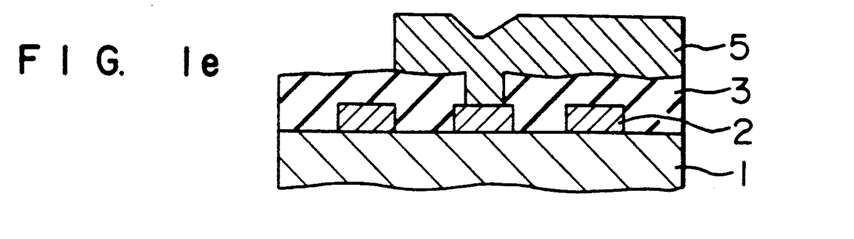

Finally, the photoresist 7 was removed by a well known $O_2$ asher. Further, as shown in FIG. 1e, a second wiring level of Al was formed on the entire surface of the substrate 1 by using the well known vacuum deposition technique, and a second wiring pattern 5 which is electrically connected with the first wiring pattern 2 was formed through the well known selective etching technique. Although not shown, another photoresist mask pattern was used also in selective-etching the second wiring layer and this photoresist mask was removed after the selective etching by the $O_2$ asher as mentioned above. Also in this case, the residual content of methyl was almost inchanged as compared with that after the $O_2$ RIE process and cracks were not generated.

As mentioned above, in this embodiment, the RIE plasma process at $O_2$ 50 m Torr was conducted in the two steps of FIG. 1c and FIG. 1d (in the step of FIG. 1d, the side wall of the opening 4 was processed). The processing for the side wall of the opening was particularly efficient when the insulating layer 3 was comparatively thick. Incidentally in some cases only performing the $O_2$ RIE plasma processing after the opening 4 was provided (without conducting the $O_2$ RIE plasma process in the step of FIG. 1c) was efficient to prevent the crack generation in accordance with the thickness of the insulating layer 3 and the manner of removing the photoresist.

Embodiment 2

First, coated on a Si substrate was a commercially available polymethyl siloxane solution in which monomers and oligomers of $RSi(OH)_3$, $R_2Si(OH)_2$ and $Si(OH)_4$ (R is a methyl $CH_3$) are solved in an alcohol solvent at their suitable rate thereby to form application films having several thicknesses in a range of 0.3 µm–1.2 µm. These films were cured under the condition of 200° C.×30 minutes in $N_2$. These films were further subjected to the $O_2$ RIE plasma process by the parallel plate RIE reactor. Unlike Embodiment 1, the processing condition of the $O_2$ pressure of 10–400 m Torr, the output of 200–500 W and the processing time of 20–160 minutes was adopted. A susceptor of graphite or $SiO_2$ was used.

Figure 3:
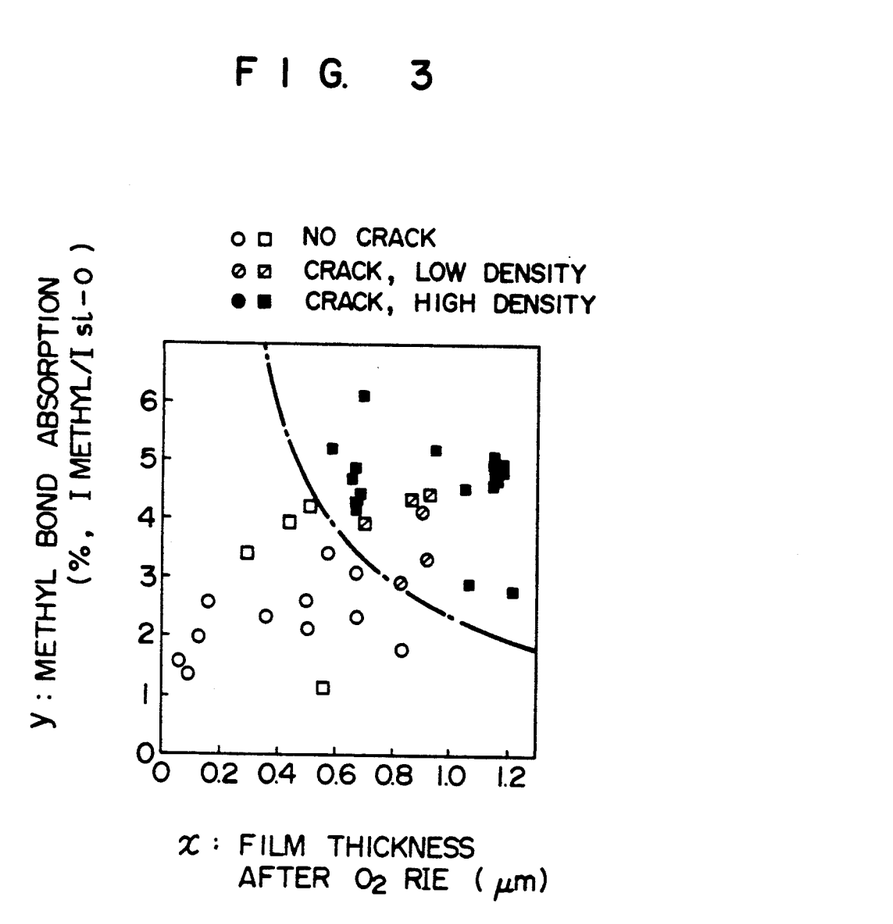

The application films subjected to the above $O_2$ RIE process did not generate any cracks when the subsequent ashing was performed. However, the application films provided with an opening after the above processings provided, in some case, some cracks when the subsequent ashing was conducted. FIG. 3 shows the state of crack generation in the film with openings after the ashing that follows $O_2$ RIE and opening formation. As seen in FIG. 3, no cracks are generated in a film having a small thickness after the $O_2$ RIE and a low methyl density. A one-dot chain line in FIG. 3 indicates a boundary dividing the regions where crack generation occurs and does not occur. This line is represented by where x is a film thickness (µm) and y is a ratio (%, $I_{methyl}/I_{Si-O}$) of the absorption intensity of the methyl absorption band to that of the Si-O coupling absorption band in the infrared absorption measurement. Incidentally, marks ○, ⊘ and ● indicate the values when a graphite susceptor was used and marks □, ▨ and ■ indicate the values when an $SiO_2$ susceptor was used. Further, the marks ○ and □ represent absence of crack generation; the marks ⊘ and ▨ represent crack generation at a low density; and the marks ● and ■ represent crack generation at a high density.

It is seen from FIG. 3 that the marks ○ and □ representing the absence of crack generation are located in the range:

$$1.0 \leq y \leq 4.5$$

On the other hand, it was confirmed that in the film without any pretreatment as mentioned above subjected to the ashing by the barrel type $O_2$ plasma reactor, the methyl concentration is abruptly decreased (0.5% within 10 minutes by the ashing under the condition of $O_2$ 5 Torr and 300 W) and cracks are generated at a high density as in the sample identified in connection with FIG. 3.

Figure 4:
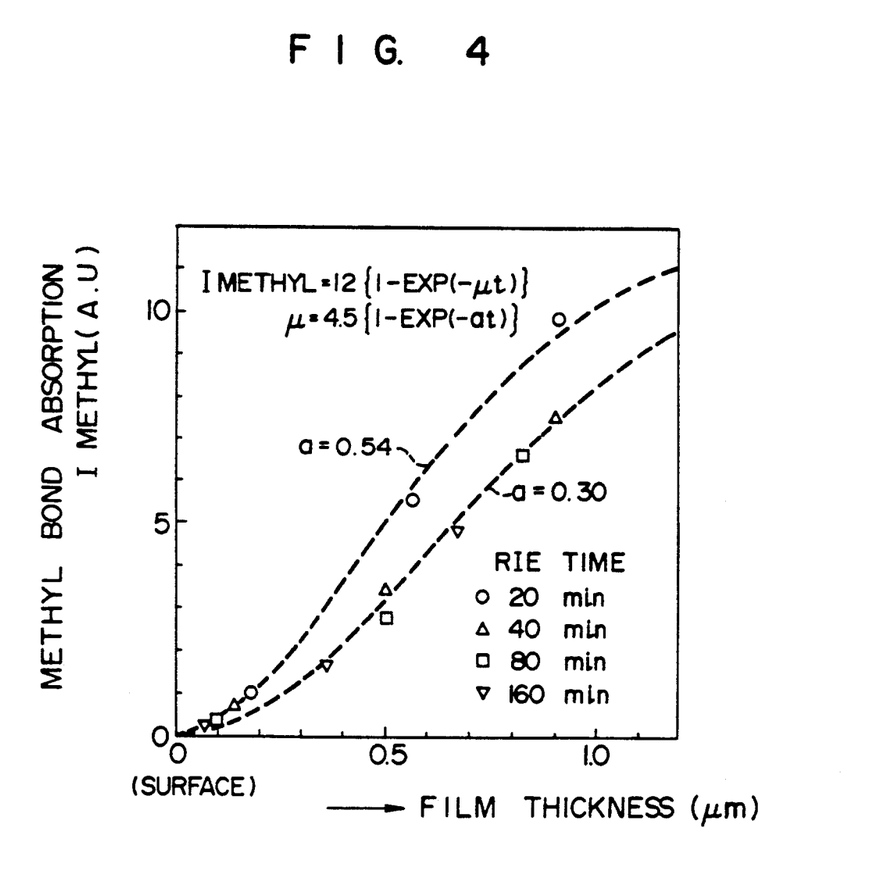

Infrared absorption measurement for the siloxane films marked with ○ and □ in FIG. 3 were carried out for different film thicknesses. A typical example of the measurement result is shown in FIG. 4. The processing condition in this condition is $O_2$ 50 m Torr, 200 W and use of a graphite susceptor.

It was confirmed that the absorption intensity $I_{methyl}$ of the methyl absorption band is represented by $$I_{methyl} = I_o \{1-EXP(-\mu t)\}$$

and in approximation of the measured values plotted in FIG. 4, the absorption coefficient $\mu$ in the above equation is substantially proportional to the film thickness (t). Namely, $\mu = \mu_o t$. Since $\mu$ is considered to be proportional to the methyl concentration, the result of FIG. 4 represents that the siloxane film having the methyl concentration increasing in proportion to the depth of the film thickness has excellent crack resistance.

The reason why cracks may be generated although the value of y in FIG. 3 is in the range of 1.0–4.5% is that if the side wall of the opening is taken at another surface, there can not be satisfied the condition that the residual methyl concentration in the direction perpendicular to the side wall surface is substantially zero (i.e., inorganic) in the surface and is increased in proportion to the depth from the side wall surface.

The above condition could be satisfied by conducting the above $O_2$ RIE process again after the opening was provided, thereby efficiently preventing cracks from being generated.

Embodiment 3

An Si substrate with an $SiO_2$ film provided on its surface by thermal oxidation was prepared. Formed on the substrate was a three-layer-laminated film. These three layers include, in order from the bottom, a plasma CVD SiO film having a thickness of 0.2 μm, the same polymethyl siloxane coated film as used in Embodiment 1, having a thickness of 0.4–0.8 μm at the flat portion, and another plasma CVD SiO film having a thickness of 0.2 μm. After the above polymethyl siloxane coated film (silicone film) was formed, it was subjected to the $O_2$ RIE plasma process before the deposition of the overlying plasma SiO film. The process conditions were $O_2$ 50 m Torr, 500 W, 30 minutes and use of a graphite susceptor. When the three-layer-laminated film was subjected to the ashing processing, no crack was generated. A via hole for wiring connection was formed in the three-layer-laminated film. The resist film used as a mask in forming the via hole was removed by the ashing. Then, in a sample for comparison not subjected to the $O_2$ RIE processing, cracks starting from the side wall thereof were generated. On the other hand, in the sample previously subjected to the $O_2$ RIE process before the ashing, no crack was generated in the side wall of the via hole. As a result of having varied the $O_2$ pressure, it was confirmed as in Embodiment 1 that the $O_2$ RIE plasma processing under the $O_2$ pressure in the range of 10 m Torr–400 m Torr is particularly efficient to prevent the crack generation. The graphite susceptor rather than the $SiO_2$ susceptor was more efficient to prevent the crack generation. The above effect of preventing the crack generation was recognized also when part of the $O_2$ is replaced by or used together with at least one of $N_2$, NO, $N_2O$, CO, and $CO_2$. The addition of $CF_4$ further improved crack resistance, moisture resistance and connection property for metal, etc.

There was a problem that if the $O_2$ RIE process in accordance with this embodiment is not performed, the overlying wiring at the via hole may be deteriorated frequently. This is considered because plasma existing when the overlying wiring is formed by sputtering, etc. changes the quality of the siloxane film exposed to the plasma at the surface of the side wall of the via hole and the gas thus generated deteriorates the quality of the overlying wiring metal. It was confirmed that the $O_2$ RIE process performed after the provision of the via hole efficiently restrains the deterioration of the above wiring.

The silicone resin coating films mentioned in connection with the above embodiments were obtained by applying a commercially available coating solution containing $RSi(OH)_3$, $R_2Si(OH)_2$ and $Si(OH)_4$ and solidifying it at 200° C. However, the above several effects can be obtained for the other organosiloxane film and namely for the Si organic compound generally termed "silicone resin". Also, the solidifying temperature is not limited to 200° C. and may be appropriately set at a temperature where the film is not decomposed.

Further, the etching rate was linearly increased as the $O_2$ pressure was lowered. And the thickness of the quality-changed layer ($SiO_2$ layer) became thin as the $O_2$ pressure was lowered. Thus, the quality-changed layer can be etched back using the etching rate increased with the lowered $O_2$ pressure.

Embodiment 4

In order to provide a film having a $[Si-O]_n$ bond SOG solution (available from Tokyo Ooka Co., Ltd. by a trade name of OCO Type-2) was spin-coated on an Si substrate to form a film of Si-O compound having a thickness of 0.2 μm. This Si substrate was baked under the conditions of 200° C.×30 minutes and 450° C. ×30 minutes in $N^2$ gas atmosphere. Next, the Si substrate was plasma-processed using $O_2$ gas in the parallel plate type plasma reactor. The processing conditions were the gas pressure of 50 m Torr, power of 500 W and processing time of 30 minutes. The RF frequency was 13.56 MHz. When the susceptor was made of graphite, the appeared plasma color was yellow, which exhibited the existence of CO molecules. This is considered because carbon in the graphte reacted with the $O_2$ plasma. For comparison, the same processing was carried out using a susceptor made of $SiO_2$. These susceptors were held at a temperature of 100° C. or lower by water cooling.

Figure 5:
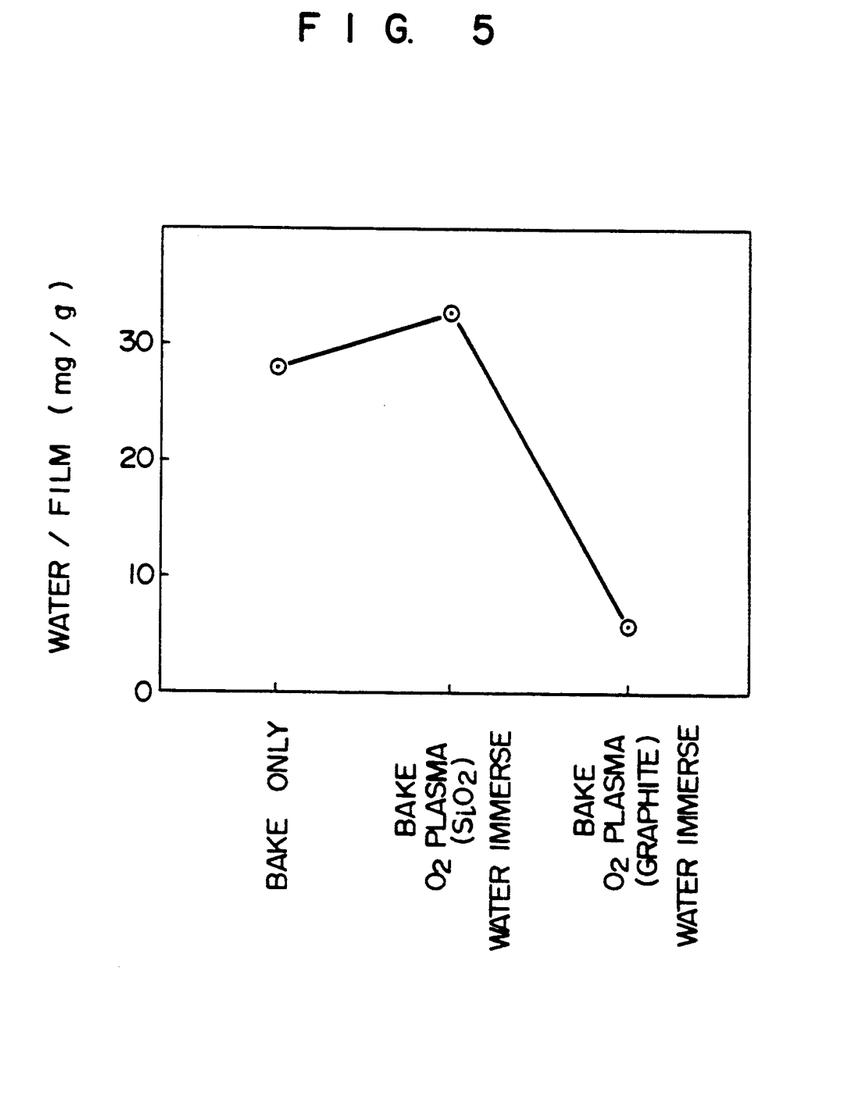

FIG. 5 shows weight of water (normalized by the weight of the film) contained in the films subjected to only the baking and to the plasma processing and immersing in water for 10 minutes after the baking. The water content was measured by mass spectrometry measurement of the gas evolved from the substrate when the substrate was heated in vacuum atmosphere. From FIG. 5 it can be seen that the plasma processing using the graphite susceptor abruptly reduces the water content or moisture contained in the film. Also it can be seen that the plasma processing using the $SiO_2$ susceptor, which does not generate CO molecules, does not substantially provide a change of the water content, which represents that only the $O_2$ plasma processing using the $SiO_2$ susceptor can not almost have an effect of removing water or improving absorbability of the film.

Embodiment 5

A film of Si-O compound having a thickness of 0.3 μm was formed on an Si substrate by the CVD technique. This Si substrate was baked under the condition of 450° C. ×30 minutes in N gas atmosphere. Next, the Si substrate was plasma-processed using mixed gas consisting of $N_2$ and $O_2$ in the parallel plate type plasma reactor. The process conditions were the gas pressure of 10 m Torr, power of 300 W and processing time of 30 minutes. The RF frequency was 13.56 MHz. It was confirmed that the above processing reduces by half the absorption peak indicative of the existence of —OH radical in the infrared absorption measurement.

As in Embodiments 4 and 5, by bringing the insulating film mainly composed of $SiO_2$ into contact with an active gas(e.g. plasma) consisting of oxygen and at least one selected from the group consisting of nitrogen and carbon, a very improved insulating film can be obtained.

We claim:

1. A method for fabricating an insulating film comprising the steps of
   (a) applying silicone resin having a repeating siloxane bond as a main chain and a methyl side radical on a substrate to form an coating film thereon, said substrate having a first level wiring pattern thereon;
   (b) baking said substrate at a temperature where said coating film is not resolved thereby to solidify said coating film;
   (c) subjecting the surface of said coating film to a reactive ion etching in an atmosphere containing at least $O_2$ at a gas pressure of 10–400 m Torr so that the surface of said coating film becomes inorganic and also the residue of an organic radical contained in the coating film is distributed to gradually increase in the depth direction of said coating film;
   (d) forming a photoresist film having a predetermined pattern on said coating film;
   (e) removing an exposed portion of said coating film to form a hole so that a part of surface of said first level wiring pattern is exposed through the hole; and
   (f) forming a second level wiring pattern which is connected electrically to said first level wiring pattern through said hole and extending onto a surface of said coating film.

2. A method of fabricating an insulating film according to claim 1, further comprising the steps successive to the step (c) of
   (d) forming a hole at a predetermined position of said coating film; and
   (e) subjecting the exposed inner side wall of said hole to the reactive ion etching in an atmosphere containing at least $O_2$ so that the surface of the side wall is inorganized.

3. A method for fabricating an insulating film according to claim 2, wherein said reactive ion etching in step (e) is carried out in an atmosphere containing at least $O_2$ at the gas pressure of 10–400 m Torr.

4. A method of fabricating an insulating film according to claim 1, wherein said reactive ion etching is carried out using a parallel plate type ion etching reactor.

5. A method for fabricating an insulating film according to claim 1, wherein said reactive ion etching is carried out using a microwave plasma etching apparatus.

6. A method for fabricating an insulating film according to claim 1, wherein said atmosphere contains at least one selected from the group consisting of $O_2$, CO, $CO_2$, NO, and $NO_2$.

7. A method for fabricating an insulating film according to claim 6, wherein said atmosphere further contains at least one of $N_2$ and $CF_4$.

8. A method for fabricating an insulating film according to claim 1, further comprising the step of forming a hole in said coating film previously to the step of (c), wherein the surface of said application film and the side wall surface of said hole are inorganized in the step of (c).

9. A method for fabricating an insulating film according to claim 8, wherein said reactive ion etching is carried out using a parallel plate type ion etching reactor.

10. A method for fabricating an insulation film according to claim 8, wherein said reactive ion etching is carried out using a microwave plasma etching apparatus.

11. A method for fabricating an insulating film according to claim 8, wherein said atmosphere contains at least one selected from the group consisting of $O_2$, CO, $CO_2$, NO and $NO_2$.

12. A method for fabricating an insulating film according to claim 11, wherein said atmosphere further contains at least one of $N_2$ and $CF_4$.

13. A method for fabricating an insulating film according to claim 1, wherein said reactive ion etching is carried out in such a state that said substrate is placed on a susceptor made of graphite.

14. A method for fabricating an insulating film according to claim 8, wherein said reactive ion etching is carried out in such a state that said substrate is placed on a susceptor made of graphite.

15. A method for fabricating an interlayer insulating film in a multi-layer wiring comprising:
   applying silicone resin having a repeating siloxane bond as a main chain and a methyl side radical on a substrate having a first level wiring pattern thereon to form a coating film;
   baking said coating film at a temperature at which said coating film is not resolved to form a solidified coating film;
   subjecting an exposed surface of said solidified coating film to a reactive ion etching in an atmosphere containing at least $O_2$ at a gas pressure of 10–400 m Torr so that said exposed surface of said solidified coating film becomes inorganic and also that residue of an organic radical contained in said coating film is distributed to gradually increase in the depth direction of said coating film;
   forming a hole at a predetermined position of said solidified coating film; and
   forming a second level wiring pattern over said exposed surface of said solidified coating film which has been inorganized such that said first level wiring pattern and said second level wiring pattern electrically connect through said hole.

16. A method for fabricating an interlayer insulating film in a multilayer wiring according to claim 15, wherein said coating film has a thickness of at least 0.4 μm.

17. A method for fabricating an interlayer insulating film in a multilayer wiring according to claim 15, wherein said coating film has a thickness of at least 0.6 μm.

18. A method for fabricating an interlayer insulating film in a multilayer wiring according to claim 15, wherein said hole is formed before subjecting said exposed surface of said solidified coating film to said reactive ion etching.

19. A method for fabricating an interlayer insulating film in a multilayer wiring according to claim 15, wherein said hole is formed after subjecting said exposed surface of said solidified coating film to said reactive ion etching, and an exposed inner side wall of said hole is subjected to reactive ion etching in an atmosphere containing at least $O_2$ so that said exposed inner side wall surface is inorganized.

20. A method for fabricating an interlayer insulating film in a multilayer wiring according to claim 15, wherein said hole is formed by providing a photoresist film having a predetermined pattern on said solidified coating film and removing a portion of said solidified coating film exposed through said predetermined pattern, and wherein said photoresist film is removed by a $O_2$ plasma ashing treatment prior to forming said second level wiring pattern.

21. A method for fabricating an insulating film comprising the steps of
  (a) forming a coating film having a $(Si-O)_n$ bond as a main chain and a methyl side radical on a substrate, said substrate having a first level wiring pattern thereon;
  (b) baking said coating film;
  (c) subjecting said coating film to a reactive ion etching in an atmosphere containing at least $O_2$ at a gas pressure if 10–100 m Torr in such a state that said substrate is placed on a susceptor made of graphite;
  (d) forming a photoresist film having a predetermined pattern on said coating film;
  (e) removing an exposed portion of said coating film to form a hole so that a part of surface of said first level wiring pattern is exposed through the hole; and
  (f) forming a second level wiring pattern which is connected electrically to said first level wiring pattern through said hole and extending onto a surface of said coating film.

22. A method according to claim 21, wherein said coating film has a thickness of at least 0.4 μm.

23. A method according to claim 21, wherein said coating film has a thickness of at least 0.6 μm.

24. A method according to claim 1, wherein said coating film has a thickness of at least 0.4 μm.

25. A method according to claim 1, wherein said coating film has a thickness of at least 0.6 μm.

* * * * *